(12) United States Patent
Iwashita et al.

(10) Patent No.: US 7,781,342 B2
(45) Date of Patent: Aug. 24, 2010

(54) SUBSTRATE TREATMENT METHOD FOR ETCHING A BASE FILM USING A RESIST PATTERN

(75) Inventors: Mitsuaki Iwashita, Nirasaki (JP); Satoru Shimura, Nirasaki (JP); Keiji Tanouchi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 588 days.

(21) Appl. No.: 11/596,459

(22) PCT Filed: Apr. 28, 2005

(86) PCT No.: PCT/JP2005/008128

§ 371 (c)(1),
(2), (4) Date: Nov. 13, 2006

(87) PCT Pub. No.: WO2005/109476

PCT Pub. Date: Nov. 17, 2005

(65) Prior Publication Data
US 2007/0243711 A1 Oct. 18, 2007

(30) Foreign Application Priority Data
May 10, 2004 (JP) .............................. 2004-139458

(51) Int. Cl.
*H01L 21/311* (2006.01)

(52) U.S. Cl. .................... 438/694; 438/745; 438/753; 438/756; 438/757; 216/83; 216/87; 430/5; 430/311

(58) Field of Classification Search ................ 438/745, 438/753, 756, 757; 216/83, 87; 430/5, 311
See application file for complete search history.

(56) References Cited

U.S. PATENT DOCUMENTS

| | | | | |
|---|---|---|---|---|
| 4,536,271 A | * | 8/1985 | Collins | 204/192.36 |
| 4,795,582 A | * | 1/1989 | Ohmi et al. | 252/79.3 |
| 5,629,062 A | * | 5/1997 | Ejiri et al. | 428/36.9 |
| 6,136,505 A | * | 10/2000 | Tanabe et al. | 430/273.1 |
| 6,426,300 B2 | * | 7/2002 | Park et al. | 438/700 |
| 7,129,009 B2 | * | 10/2006 | French et al. | 430/5 |
| 2002/0170878 A1 | * | 11/2002 | Wang et al. | 216/41 |
| 2005/0202347 A1 | * | 9/2005 | Houlihan et al. | 430/311 |
| 2006/0154188 A1 | * | 7/2006 | Hirayama et al. | 430/338 |
| 2007/0134593 A1 | * | 6/2007 | Hirayama et al. | 430/270.1 |

FOREIGN PATENT DOCUMENTS

| | | |
|---|---|---|
| JP | 06 069118 | 3/1994 |
| JP | 07 239558 | 9/1995 |
| JP | 08 031720 | 2/1996 |
| JP | 2003 133295 | 5/2003 |
| JP | 2003 158072 | 5/2003 |
| JP | 2003 255564 | 9/2003 |
| JP | 2004 126080 | 4/2004 |

\* cited by examiner

*Primary Examiner*—Shamim Ahmed
*Assistant Examiner*—Maki A Angadi
(74) *Attorney, Agent, or Firm*—Oblon, Spivak, McClelland, Maier & Neustadt, L.L.P.

(57) ABSTRACT

A substrate treatment method which includes a developing step of developing a resist film on a substrate to form a resist pattern on the substrate, and thereafter includes an etching step of etching a base film using the resist pattern as a mask. The substrate treatment method, between the developing step and the etching step, supplies a fluorine-based liquid to the resist pattern to form a protection film with a high fluorine density on a surface of the resist pattern.

13 Claims, 12 Drawing Sheets

SUBSTRATE TREATMENT METHOD FOR ETCHING A BASE FILM USING A RESIST PATTERN

TECHNICAL FIELD

The present invention relates to a substrate treatment method and a substrate treatment apparatus.

BACKGROUND ART

In a semiconductor device manufacturing process using the photolithography technique, for example, a resist coating treatment of applying a resist solution onto a film to be etched on a wafer surface to form a resist film, exposure processing of exposing a predetermined pattern on the resist film on the wafer, a developing treatment of developing the exposed resist film on the wafer to form a resist pattern, an etching treatment of etching a base film using the resist pattern as a mask and so on are performed in order.

Incidentally, in recent years, to further miniaturize the circuit pattern, an exposure technology is being employed which uses an exposure light source with a short wavelength of 193 nm or less, such as an ArF laser, F2 laser, or the like. Therefore, it is necessary to use a material corresponding to the exposure light source with a short wavelength for a resist solution to be supplied onto the wafer surface.

However, the resist solution corresponding to a light with a short wavelength of 193 nm or less has a relatively low etch resistance and may have been etched together with the base film during the etching treatment. Accordingly, the dimensions of a groove and a hole to be finally formed in the base film are larger than the expected dimensions, failing to stably form a circuit pattern of a desired dimension.

Development of the resist material is proceeding to improve the etch resistance of the resist pattern but has limits, and sufficient etch resistance has not been realized. Besides, a method of forming a resist pattern is proposed in which photosensitive light is applied to the entire resist patter and the resist pattern is then baked during process of the wafer processing to improve the etch resistance (for example, see Patent Document 1).

However, the above-described method is directed to the resist pattern having a benzene ring corresponding to the exposure light source with a wavelength of 250 nm or longer, and therefore does not present a sufficient effect for a resist pattern corresponding to the exposure light source with a short wavelength of 193 nm or less.

Patent Document
Japanese Patent Application Laid-open No. H6-69118

DISCLOSURE OF THE INVENTION

Problems to be Solved by the Invention

The present invention has been developed in consideration of the above viewpoints and its object is to provide a substrate treatment method and a substrate treatment apparatus for a wafer or the like to improve the etch resistance of a resist pattern corresponding to the exposure light source with a short wavelength.

Means for Solving the Problems

To attain the above object, a substrate treatment method of the present invention including a developing step of developing a resist film on a substrate to form a resist pattern on the substrate, and thereafter, an etching step of etching a base film using the resist pattern as a mask, includes the step of, between the developing step and the etching step, supplying a fluorine-based liquid to the resist pattern.

According to the present invention, a fluorine-based liquid is supplied to the resist pattern between the developing step and the etching step, so that molecules on the surface of the resist pattern can bond with fluorine-based molecules in the liquid to increase the density of fluorine atoms on the surface of the resist pattern. As a result, even the resist pattern corresponding to an exposure light source with a short wavelength can be improved in etch resistance.

The fluorine-based liquid may be composed of a compound with a molecular weight of 50 or more. In this case, most fluorine-based molecules in the liquid never permeate into the inside of the resist pattern but adhere to the surface, with the result that the molecules on the surface of the resist pattern can efficiently bond with the fluorine-based molecules.

The fluorine-based liquid may contain an OH group. In this case, the fluorine-based molecules in the liquid easily bond with the molecules on the surface of the resist pattern, so that the density of the fluorine atoms on the surface of the resist pattern can be efficiently increased.

The above-described substrate treatment method may further include, between the developing step and the etching step, supplying another liquid containing an OH group to the resist pattern. In this case, the surface of the resist pattern can be activated by an effect of the OH group contained in the other liquid to improve the reactivity of the surface of the resist pattern with the fluorine-based liquid. As a result, at the time of supply of the fluorine-based liquid, the density of the fluorine atoms on the surface of the resist pattern can be efficiently increased.

The step of supplying another liquid containing an OH group may be performed before the step of supplying a fluorine-based liquid, or simultaneously with the step of supplying a fluorine-based liquid.

The temperature of the fluorine-based liquid may be set to be higher than the temperature of another liquid containing an OH group. In this case, the reactivity of the fluorine-based liquid with the resist pattern can be improved, while the degradation due to the temperature of the other liquid containing an OH group can be suppressed. Note that the other liquid containing an OH group may be a surfactant.

The above-described substrate treatment method may supply energy to the resist pattern to which the fluorine-based liquid has been supplied to accelerate the reaction of the fluorine-based liquid with the surface of the resist pattern. Further, the step of accelerating the reaction of the fluorine-based liquid with the surface of the resist pattern may be performed by heating the substrate, or may be performed by applying an ultraviolet ray to the substrate.

The above-described substrate treatment method may further include the step of, after the developing step and before the step of supplying a fluorine-based liquid, oxidizing the surface of the resist pattern. Oxidizing the surface of the resist pattern before supplying the fluorine-based liquid as described above can improve the reactivity of the fluorine-based liquid with the resist pattern. As a result, the density of the fluorine atoms on the surface of the resist pattern can be efficiently increased to appropriately improve the etch resistance.

Note that the step of oxidizing the surface of the resist pattern may be performed by applying an ultraviolet ray to the substrate with the substrate being maintained in an atmosphere containing an oxygen gas.

According to another aspect of the present invention, the present invention is a substrate treatment apparatus including a liquid supply unit for supplying a fluorine-based liquid to a resist pattern between a developing treatment to form the resist pattern on the substrate and an etching treatment of a base film using the resist pattern as a mask.

According to the present invention, the fluorine-based liquid can be supplied to the resist pattern between the developing step and the etching step, so that molecules on the surface of the resist pattern can bond with the fluorine-based molecules in the liquid to increase the density of fluorine atoms on the surface of the resist pattern. As a result, the etch resistance of the resist pattern can be improved.

The above-described substrate treatment apparatus may further include another liquid supply unit for supplying another liquid containing an OH group to the resist pattern between the performance of the developing treatment and the performance of the etching treatment. In this case, the surface of the resist pattern can be activated by an effect of the OH group contained in the other liquid to accelerate bond of the molecules on the surface of the resist pattern with the fluorine-based molecules. As a result, at the time of supply of the fluorine-based liquid, the density of the fluorine atoms on the surface of the resist pattern can be efficiently increased.

The above-described substrate treatment apparatus may further include an energy supply unit for supplying energy to the resist pattern to which the fluorine-based liquid has been supplied to accelerate the reaction of the fluorine-based liquid with the surface of the resist pattern.

The substrate treatment apparatus may further include an oxidation unit for oxidizing the surface of the resist pattern before the supply of the fluorine-based liquid. In this case, the surface of the resist pattern can be oxidized before the supply of the fluorine-based liquid, so that the reactivity of the fluorine-based liquid with the resist pattern can be improved. As a result, the density of the fluorine atoms on the surface of the resist pattern can be efficiently increased to appropriately improve the etch resistance.

Note that the oxidation unit may include a container for housing the substrate; an oxygen-containing gas supplier for supplying an oxygen-containing gas into the container; and an ultraviolet irradiator for applying an ultraviolet ray to the substrate in the container.

EFFECT OF THE INVENTION

According to the present invention, the etch resistance to the resist pattern for a light with a short wavelength is improved, leading to microfabrication of the circuit pattern.

EXPLANATION OF CODES 1 coating and developing treatment system
33 liquid supply unit
131 liquid supply nozzle
W wafer

BEST MODE FOR CARRYING OUT THE INVENTION

Figure 1:
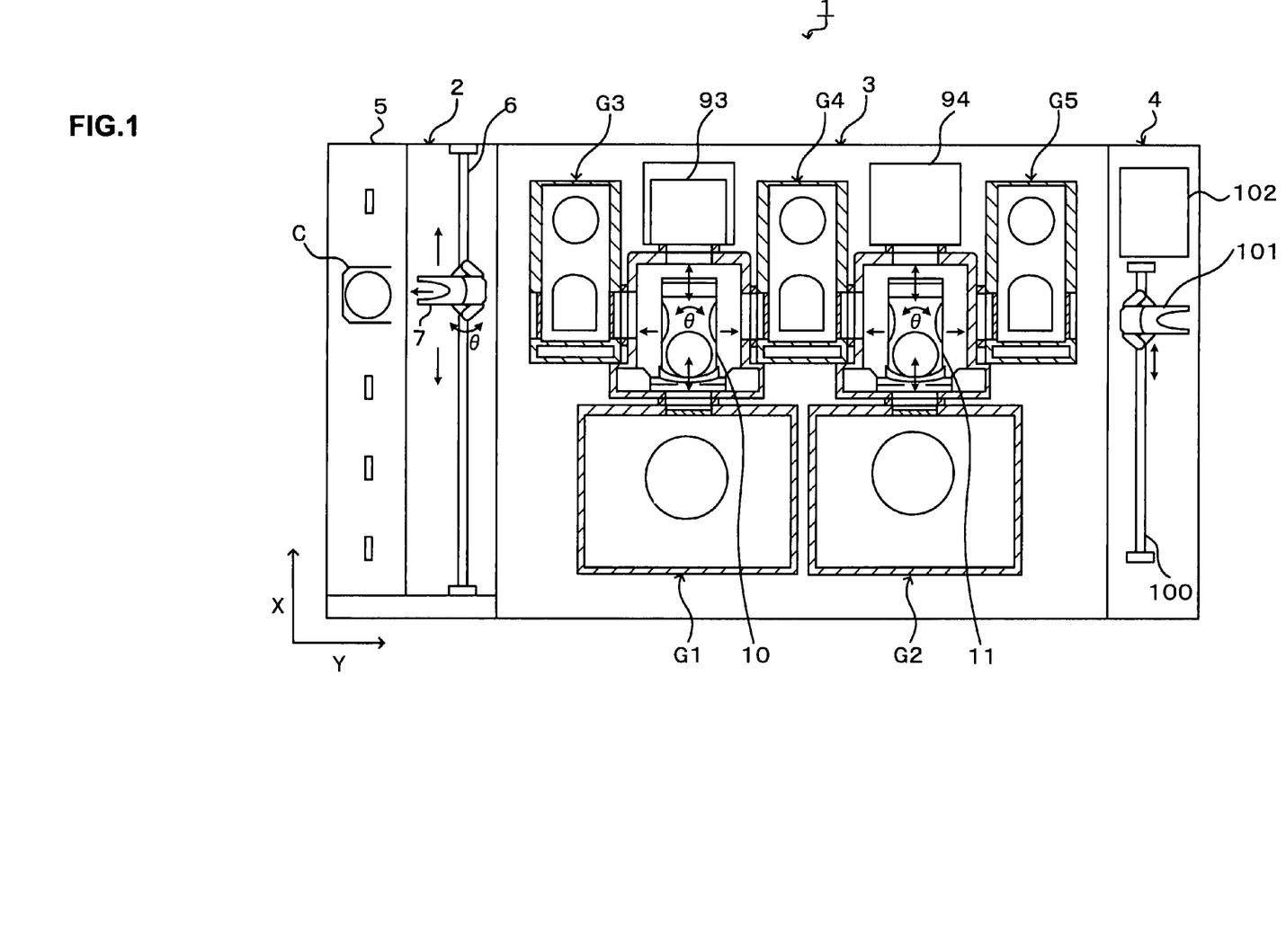
FIG. 1 A plan view showing the outline of a configuration of a coating and developing treatment system in the present embodiment.
Figure 2:
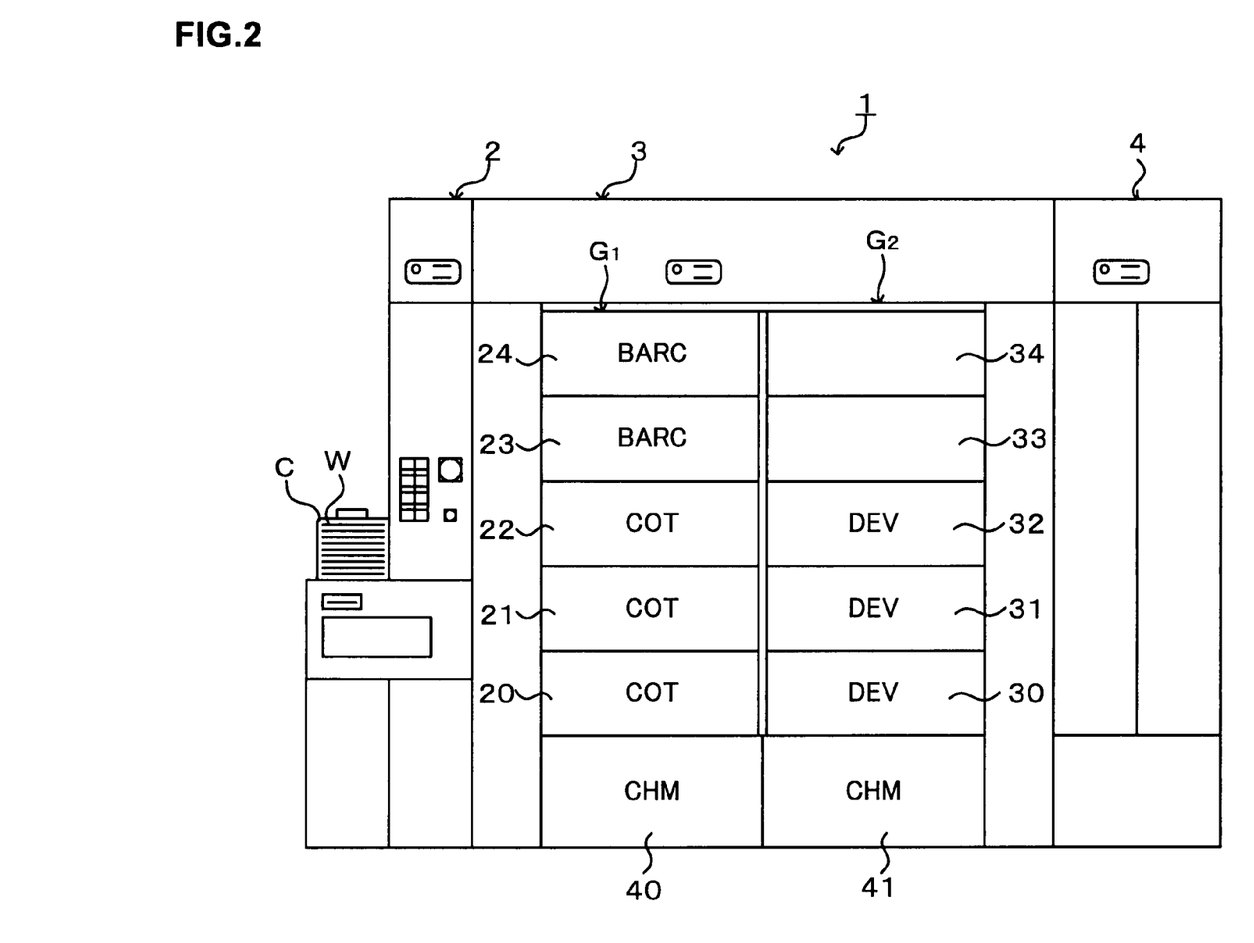
FIG. 2 A front view of the coating and developing treatment system in FIG. 1.
Figure 3:
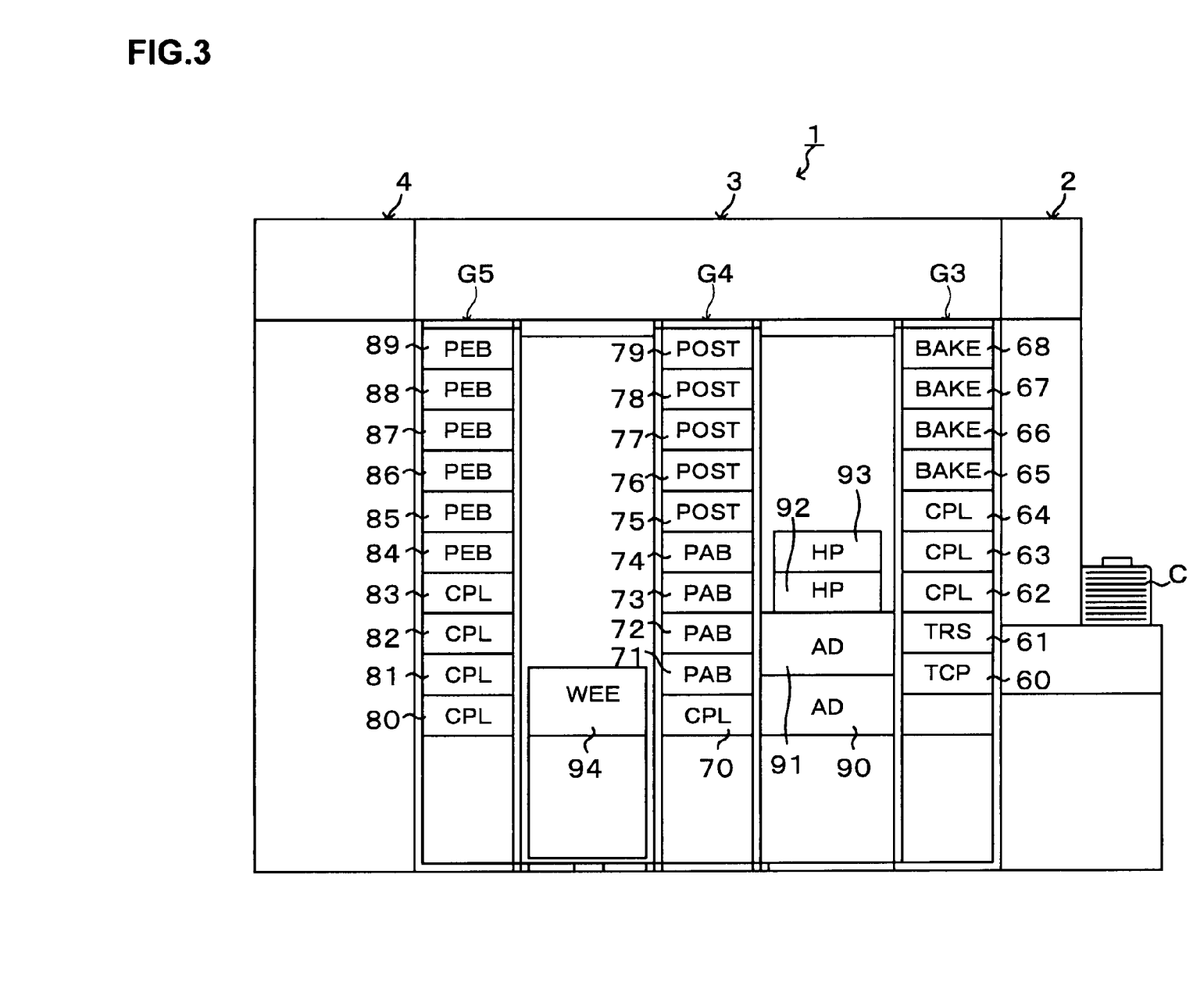
FIG. 3 A rear view of the coating and developing treatment system in FIG. 1.

Hereinafter, preferred embodiments of the present invention will be described. FIG. 1 is a plan view showing the outline of a configuration of a coating and developing treatment system 1 as a substrate treatment apparatus according to the present invention, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for carrying, for example, 25 wafers W per cassette as a unit from/to the outside into/from the coating and developing treatment system 1 and carrying the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for transferring the wafers W to/from a not-shown aligner provided adjacent to the processing station 3, are integrally connected together.

In the cassette station 2, a plurality of cassettes C can be mounted at predetermined positions on a cassette mounting table 5 in a line in an X-direction (a top-to-bottom direction in FIG. 1). In the cassette station 2, a wafer carrier 7 is provided which is movable in the X-direction on a carrier path 6. The wafer carrier 7 is also movable in a wafer-arrangement direction of the wafers W housed in the cassette C (a Z-direction; the vertical direction), and thus can selectively access the wafers W in each of the cassettes C arranged in the X-direction.

The wafer carrier 7, which is rotatable in a O-direction around the Z-axis, can access a temperature regulating unit 60 and a transition unit 61, which will be described later, included in a third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first carrier unit 10 is provided. The first carrier unit 10 can selectively access the processing and treatment units in the first processing unit group G1, the third processing unit group G3, and the fourth processing unit group G4 and carry the wafer W to them. Between the fourth processing unit group G4 and the fifth processing unit group G5, a second carrier unit 11 is provided. The second carrier unit 11 can selectively access the processing and treatment units in the second processing unit group G2, the fourth processing unit group G4, and the fifth processing unit group G5 and carry the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 32 each for supplying a developing solution to the wafer W to develop it and liquid supply units 33 and 34 each for supplying a fluorine-based liquid to the wafer W are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature thermal processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of thermal processing units each for performing thermal processing for the wafer W, for example, high-precision temperature regulating units 80 to 83 and post-exposure baking units 84 to 89 each for heat-processing the wafer W after exposure, are ten-tiered in order from the bottom.

A plurality of processing and treatment units are arranged on the positive direction side in the X-direction of the first carrier unit 10 as shown in FIG. 1, for example, adhesion units 90 and 91 each for performing hydrophobic treatment for the wafer W and heating units 92 and 93 each for heating the wafer W being four-tiered in order from the bottom as shown in FIG. 3. As shown in FIG. 1, on the positive direction side in the X-direction of the second carrier unit 11, for example, an edge exposure unit 94 is disposed which selectively exposes only the edge portion of the wafer W to light.

In the interface section 4, for example, a wafer carrier 101 moving on a carrier path 100 extending in the X-direction and a buffer cassette 102 are provided as shown in FIG. 1. The wafer carrier 101 is movable in the Z-direction and also rotatable in the θ-direction and thus can access the not-shown aligner adjacent to the interface section 4, the buffer cassette 102, and the fifth processing unit group G5 and carry the wafer W to them.

Figure 4:
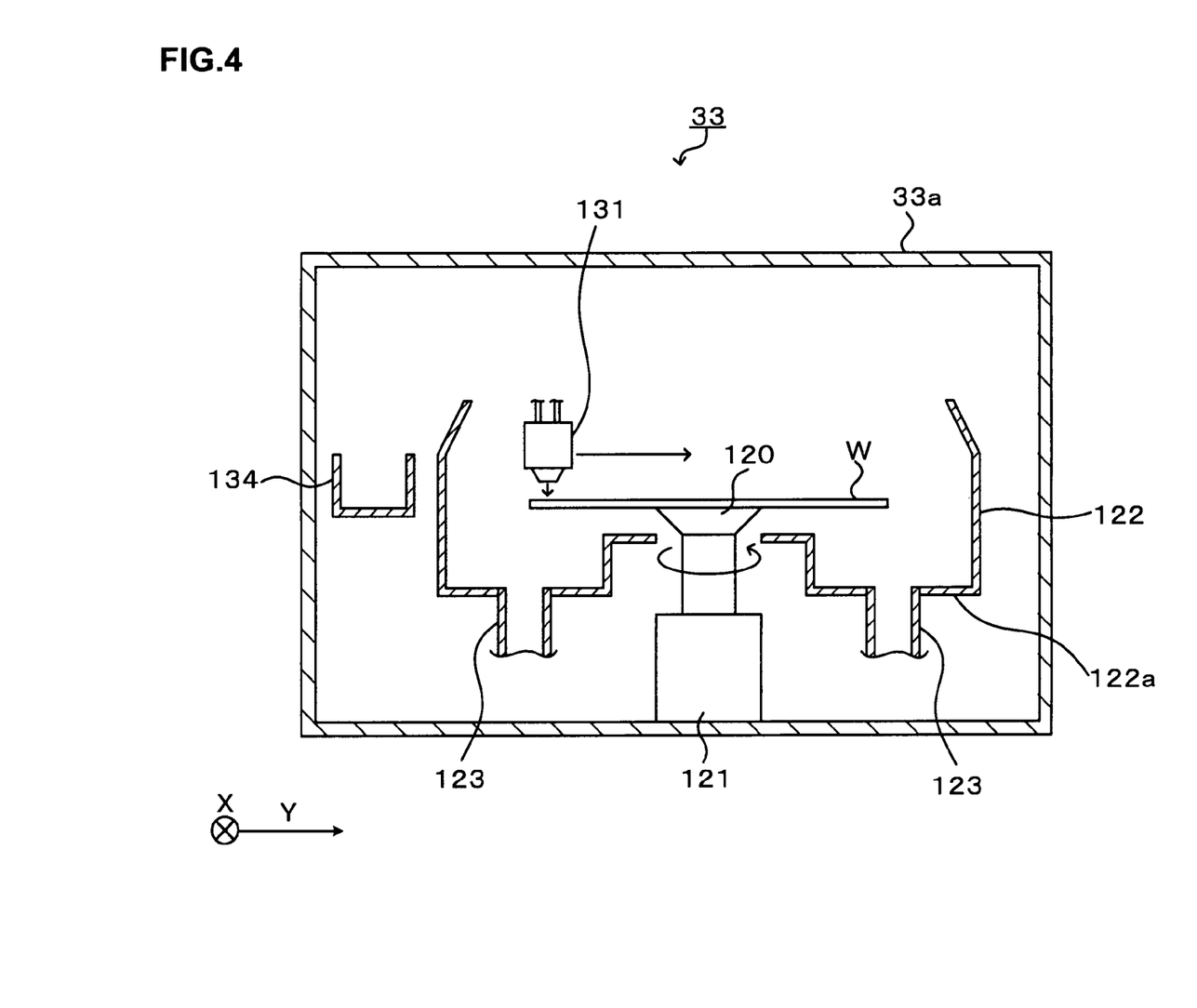
FIG. 4 An explanatory view of a longitudinal section showing the outline of a configuration of a liquid supply unit.
Figure 5:
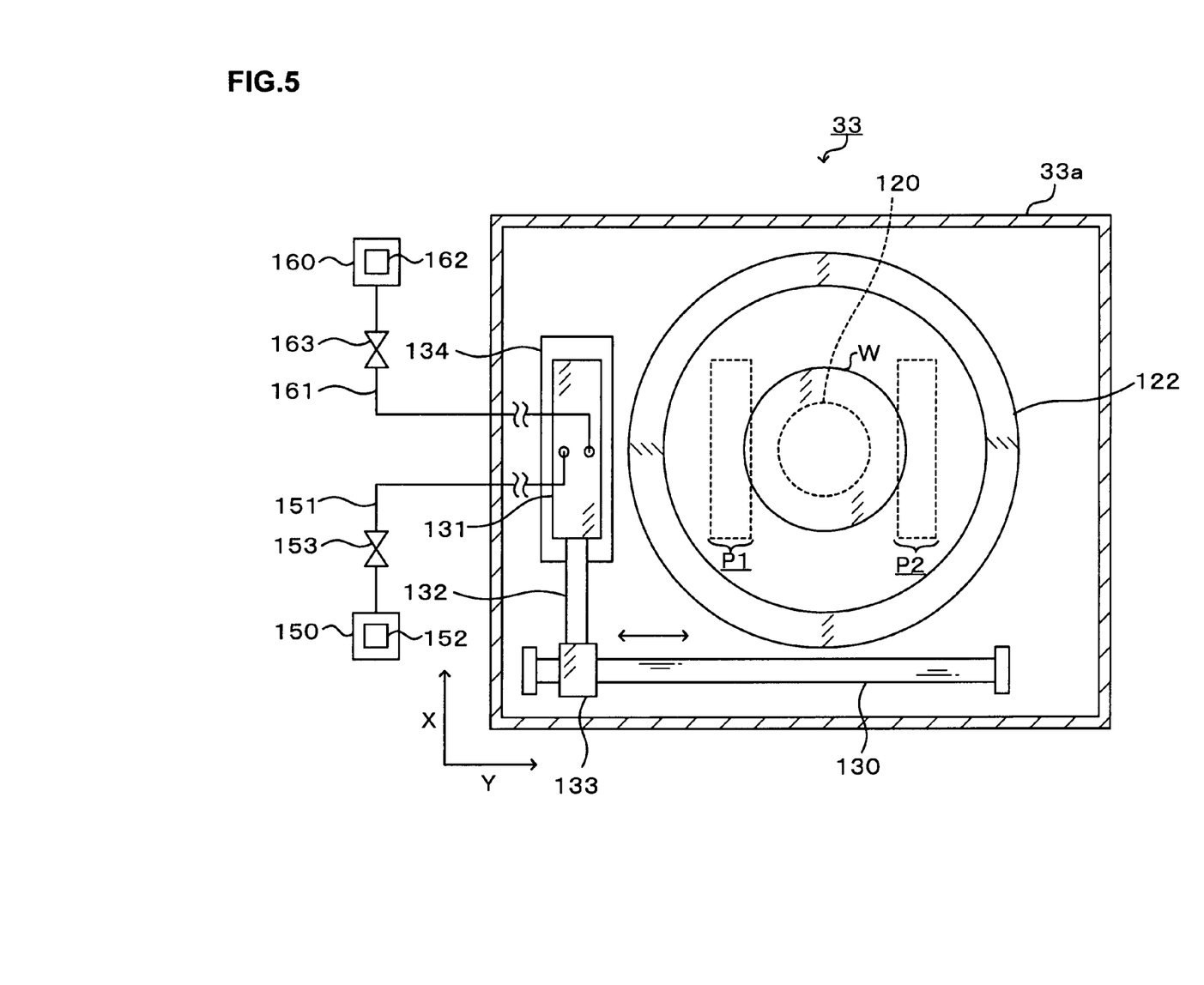
FIG. 5 An explanatory view of a transverse section showing the outline of the configuration of the liquid supply unit FIG. 6 A perspective view of a liquid supply nozzle.

Next, the configuration of the above-described liquid supply unit 33 will be described in detail. FIG. 4 is an explanatory view of a longitudinal section showing the outline of the configuration of the liquid supply unit 33, and FIG. 5 is an explanatory view of a transverse section showing the outline of the configuration of the liquid supply unit 33.

As shown in FIG. 4, the liquid supply unit 33 has a casing 33*a*. At the central portion in the casing 33*a*, a spin chuck 120 as a holding member for holding the wafer W is provided. The spin chuck 120 has a horizontal upper surface which is provided with, for example, a suction port (not shown) for sucking the wafer W. Suction from the suction port allows the wafer W to be sucked onto the spin chuck 120.

The spin chuck 120 is provided with, for example, a chuck drive mechanism 121 for rotating and raising and lowering the spin chuck 120. The chuck drive mechanism 121 includes, for example, a rotary drive unit (not shown) such as a motor for rotating the spin chuck 120 at a predetermined speed, and a raising and lowering unit (not shown) such as a motor or a cylinder for raising and lowering the spin chuck 120. The chuck drive mechanism 121 can be used to raise and lower the wafer W on the spin chuck 120 at a predetermined timing and rotate the wafer W at a predetermined speed.

Around the spin chuck 120, a cup 122 is provided for receiving and collecting the liquid scattering or dropping from the wafer W. The cup 122 is formed, for example, in an almost cylindrical shape with its bottom surface closed. The bottom surface 122*a* of the cup 122 is connected with an drain pipe 123 which is in communication with, for example, a drainage section of a factory so that the liquid collected in the cup 122 can be drained via the drain pipe 123 to the outside of the liquid supply unit 33.

As shown in FIG. 5, a rail 130 extending along the Y-direction is formed, for example, on the side of the negative direction in the X-direction (the lower direction in FIG. 5) of the cup 122. The rail 130 is formed, for example, from the outside of the cup 122 on the side of the negative direction in the Y-direction (the left direction in FIG. 5) to the vicinity of the end portion of the cup 122 on the side of the positive direction in the Y-direction (the right direction in FIG. 5). To the rail 130, an arm 132 is attached which supports a liquid supply nozzle 131 as a liquid supply unit and another liquid supply unit. The arm 132 is movable in the Y-direction on the rail 130, for example, by means of a drive unit 133, and can transfer the liquid supply nozzle 131 from a waiting section 134 provided outside the cup 122 to a position above the wafer W in the cup 122. The arm 132 is also movable in the vertical direction, for example, by means of the aforementioned drive unit 133 and can raise and lower the liquid supply nozzle 131. For example, the rail 130, the arm 132 and the drive unit 133 form a nozzle transfer mechanism.

Figure 6:
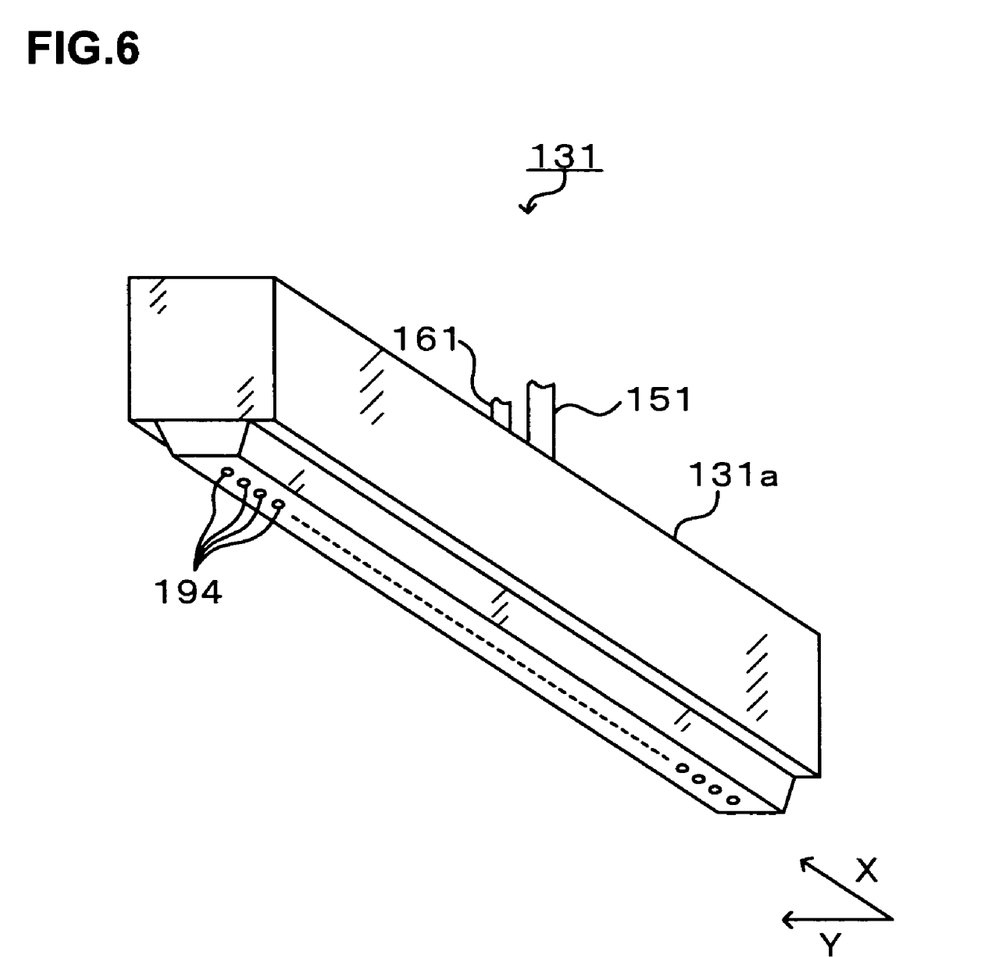
Figure 7:
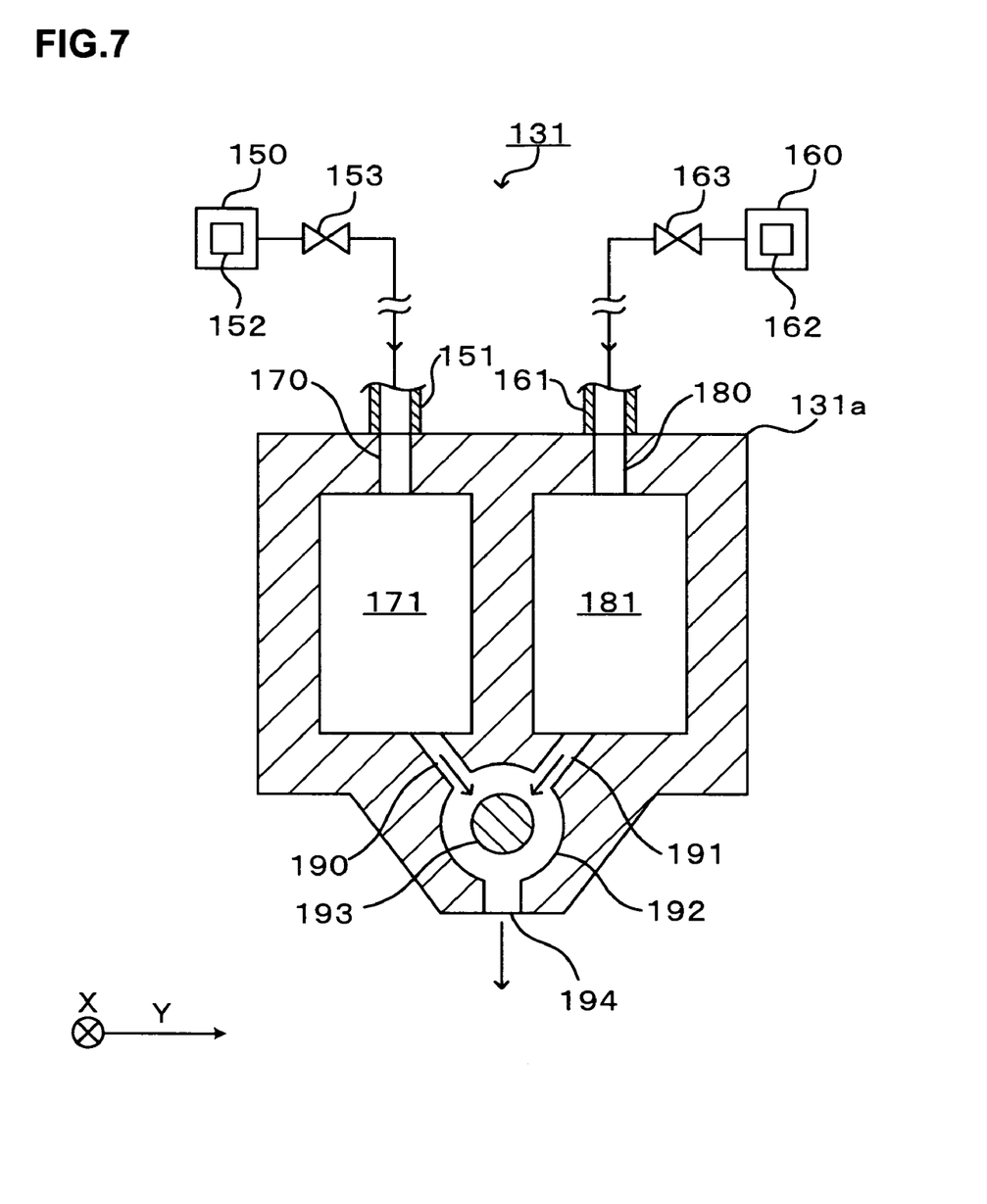
FIG. 7 A longitudinal sectional view of the liquid supply nozzle as seen in the X-direction.

As shown in FIG. 5 and FIG. 6, the liquid supply nozzle 131 has a main body 131*a* having, for example, an almost rectangular parallelepiped shape slightly longer than the dimension of the diameter of the wafer W and is supported by the arm 132 such that its longitudinal direction is oriented in the X-direction. To the upper surface of the main body 131*a*, a first liquid supply pipe 151 is connected which is in communication with a first liquid supply source 150 provided, for example, outside the casing 33*a* as shown in FIG. 5 and FIG. 7. The first liquid supply source 150 stores, for example, a fluorine-based liquid, such as a TFE solution containing TFE (trifluoroethanol) with an OH group and a molecular weight of 50 or more. This TFE solution is adjusted to have a concentration, for example, about 1.0% to about 50%. The first liquid supply source 150 is provided with, for example, a temperature regulating unit 152 so that the temperature of the TFE solution to be supplied to the liquid supply nozzle 131 can be adjusted to a predetermined temperature in the first liquid supply source 150. The first liquid supply pipe 151 is provided with an opening/closing valve 153 which can be used to supply the TFE solution in the first liquid supply source 150 to the liquid supply nozzle 131 at a predetermined timing and flow rate.

To the upper surface of the main body 131a, a second liquid supply pipe 161 is also connected which is in communication with a second liquid supply source 160 provided. The second liquid supply source 160 stores, for example, a liquid having an OH group such as a surfactant as another liquid. The second liquid supply source 160 is provided with, for example, a temperature regulating unit 162 so that the temperature of the surfactant to be supplied to the liquid supply nozzle 131 can be adjusted to a predetermined temperature in the second liquid supply source 160. The second liquid supply pipe 161 is provided with an opening/closing valve 163 which can be used to supply the surfactant in the second supply source 160 to the liquid supply nozzle 131 at a predetermined timing and flow rate.

At an upper portion in the main body 131a, a first introduction pipe 170 is formed which is in communication with the first liquid supply pipe 151. The first introduction pipe 170 is in communication with a first storage room 171 formed in the main body 131a. The first storage room 171 is formed, for example, along the longitudinal direction of the main body 131a between both end portions and can temporarily store the TFE solution introduced into the main body 131a. At an upper portion in the main body 131a, a second introduction pipe 180 is formed which is in communication with the second liquid supply pipe 161. The second introduction pipe 180 is in communication with a second storage room 181 formed in the main body 131a. The second storage room 181 is formed, for example, along the longitudinal direction of the main body 131a between both end portions such that it is provided in parallel with the first storage room 171, and can temporarily store the surfactant introduced into the main body 131a.

The first storage room 171 and second storage room 181 are in communication with a confluent room 192 at a lower portion of the main body 131a via a first communication path 190 and a second communication path 191, respectively. The confluent room 192 is formed, for example, along the longitudinal direction of the main body 131a between both end portions. The confluent room 192 is formed, for example, to have a longitudinal section as seen in the X-direction in an almost circle. In the confluent room 192, the supply pressures of the TFE solution supplied from the first storage room 171 and the surfactant supplied from the second storage room 181 can be lost. In the confluent room 192, a collision bar 193 is provided, for example, along the longitudinal direction of the confluent room 192. It is possible to allow the TFE solution supplied from the first storage room 171 and the surfactant supplied from the second storage room 181 to collide with the collision bar 193, for example, to accelerate mixing of the solutions.

The confluent room 192 is in communication with a plurality of discharge ports 194 opening in the lower surface of the main body 131a. The discharge ports 194 are formed at regular intervals in a line along the longitudinal direction of the main body 131a between both end portions as shown in FIG. 6. The discharge ports 194 allows the TFE solution and the surfactant passing through the confluent room 192 to be discharged downward in a long line shape in the X-direction. Note that the discharge ports 194 may be formed in a slit shape between both end portions of the main body 131a.

The liquid supply nozzle 131 can discharge the TFE solution supplied from the first liquid supply source 150 and the surfactant supplied from the second liquid supply source 160 through the discharge ports 194 at respective different timings. Further, the liquid supply nozzle 131 can also mix the TFE solution and the surfactant in the confluent room 192 and simultaneously discharge the TFE solution and the surfactant.

Figure 8:
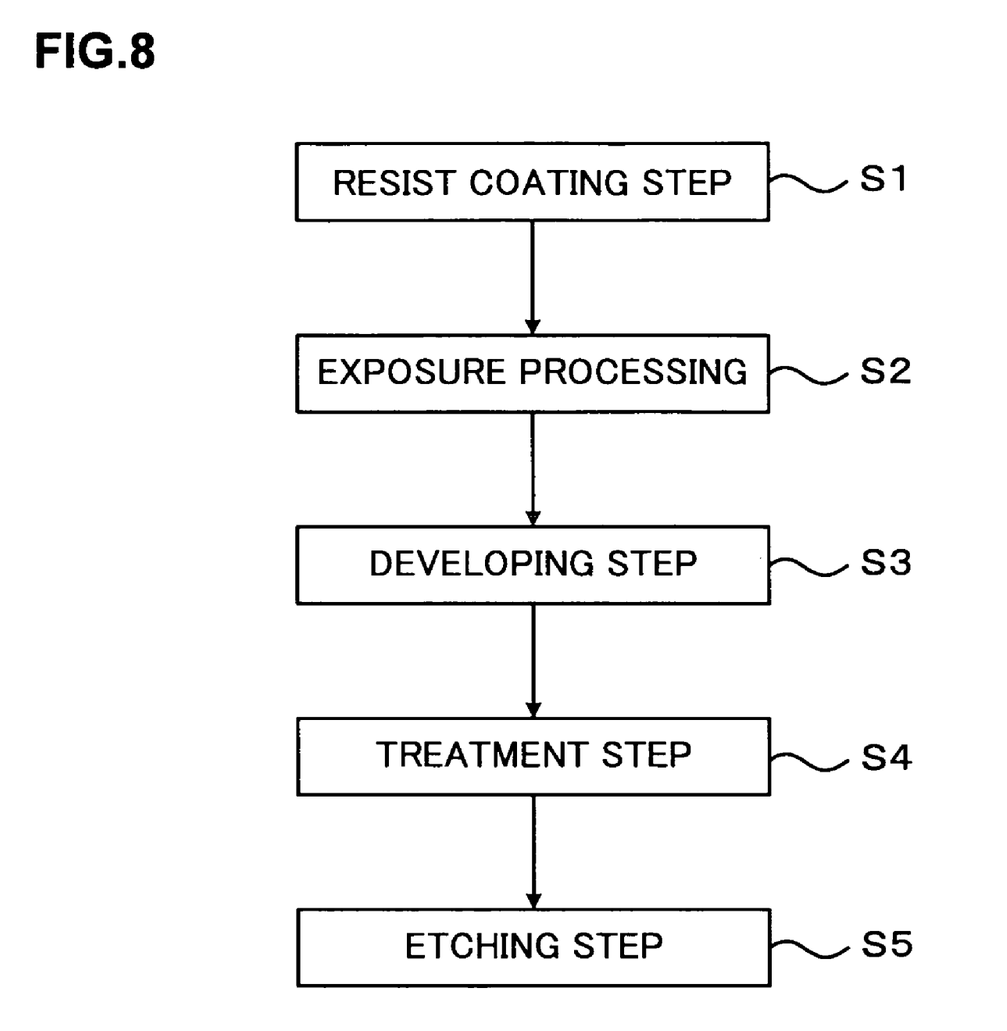
FIG. 8 A flowchart of wafer processing in the present embodiment.

Next, the process of the photolithography process performed in the coating and developing treatment system 1 configured as described above will be described. FIG. 8 is a main flowchart of the process.

First of all, one wafer W, on which a base film being a film to be etched is formed, is taken out of the cassette C on the cassette mounting table 5 by the wafer carrier 7 and carried to the temperature regulating unit 60 in the third processing unit group G3. The wafer W carried to the temperature regulating unit 60 is temperature-regulated to a predetermined temperature, and is then carried by the first carrier unit 10 into the bottom coating unit 23 where an anti-reflection film is formed on the wafer W. The wafer W on which the anti-reflection film has been formed is sequentially carried by the first carrier unit 10 to the heating unit 92, the high-temperature thermal processing unit 65, and the high-precision temperature regulating unit 70 so that predetermined processing is performed in each of the units. Thereafter, the wafer W is carried to the resist coating unit 20 where a resist solution is applied onto the wafer W to form a resist film on the wafer W (S1 in FIG. 8). Examples of the material of the resist film in use include, for example, resins containing an alicyclic group corresponding to an exposure light source with a wavelength shorter than that of an ArF laser (with a wavelength of 193 nm), such as a methacrylate resin, an acrylate resin, and so on.

The wafer W on which the resist film has been formed is carried by the first carrier unit 10 to the pre-baking unit 71 and then carried by the second carrier unit 11 to the edge exposure unit 94 and the high-precision temperature regulating unit 83 in sequence so that the wafer W is subjected to predetermined processing in each of the units. Thereafter, the wafer W is carried by the wafer carrier 101 in the interface section 4 to the not-shown aligner. In the aligner, a predetermined pattern is exposed to light by the ArF laser as the exposure light source on the resist film on the wafer W (S2 in FIG. 8). The wafer W for which exposure processing has been finished is carried by the wafer carrier 101, for example, to the post-exposure baking unit 84 where the wafer W is subjected to heat-processing, and then carried by the second carrier unit 11 to the high-precision temperature regulating unit 81 where the wafer W is temperature-regulated. The wafer W is then carried to the developing treatment unit 30 where the resist film on the wafer W is developed (S3 in FIG. 8). In this developing treatment, for example, the exposed portion of the resist film is dissolved so that the resist pattern is formed on the wafer W. The wafer W for which developing treatment has been finished is then carried by the second carrier unit 11 to the post-baking unit 75 where the wafer W is subjected to heat-processing, and is then carried to the high-precision temperature regulating unit 63 where the wafer W is temperature-regulated. Then, the wafer W is carried by the first carrier unit 10 to the liquid supply unit 33 where a predetermined treatment step is performed for the resist pattern (S4 in FIG. 8).

The wafer W carried into the liquid supply unit 33 is mounted and held on the spin chuck 120, for example, as shown in FIG. 4. Then, the liquid supply nozzle 131 waiting at the waiting section 134 as shown in FIG. 5 moves toward the positive direction side in the Y-direction and stops at a start position P1 (shown by a dotted line in FIG. 5) in front of the end portion of the wafer W on the negative direction side in the Y-direction as seen in plan view. Thereafter, the liquid supply nozzle 131 is lowered so that the discharge ports 194 are brought close to the front surface of the wafer W.

Then, the opening/closing valve 163 is opened to introduce the surfactant, which has been temperature-regulated in the second liquid supply source 160 to a predetermined temperature, for example, room temperature of about 23° C., into the main body 131a of the liquid supply nozzle 131 via the second liquid supply pipe 161, and the surfactant is discharged via the main body 131a from the discharge ports 194.

When the discharge of the surfactant is started at the start position P1, the liquid supply nozzle 131 moves, discharging the surfactant, along the Y-direction from the start position P1 to a stop position P2 (shown by a dotted line in FIG. 5) outside the wafer W on the positive direction side in the Y-direction. The movement of the liquid supply nozzle 131 supplies the surfactant onto the entire surface of the resist pattern on the wafer W. Such supply of the surfactant activates the surface of the resist pattern so that the OH groups in the surfactant bond, for example, with molecules on the surface of the resist pattern. This improves the reactivity between the surface of the resist pattern and the TFE solution supplied later.

When moved to the stop position P2, the liquid supply nozzle 131 is returned, for example, to the stop position P1 after the discharge of the surfactant is stopped. Subsequently, the opening/closing valve 153 is opened to introduce the TFE solution, which has been temperature-regulated in the first liquid supply source 150 to a predetermined temperature, for example, a temperature of about 30° C. to about 50° C. higher than that of the surfactant, into the main body 131a of the liquid supply nozzle 131 via the first liquid supply pipe 151, whereby the TFE solution is discharged from the discharge ports 194 of the liquid supply nozzle 131.

Figure 9:
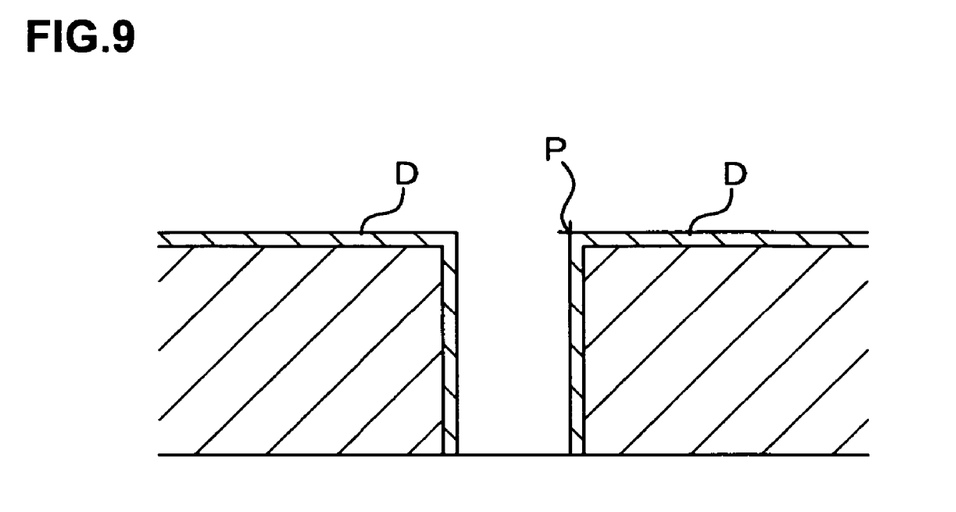
FIG. 9 A longitudinal sectional view of a resist pattern showing the state in which a protection film is formed.

When the discharge of the TFE solution is started at the start position P1, the liquid supply nozzle 131 moves again from the start position P1 to the stop position P2. The movement of the liquid supply nozzle 131 supplies the TFE solution onto the entire surface of the resist pattern. Such supply of the TFE solution causes the molecules on the surface of the resist pattern to bond with TFE molecules to increase the density of fluorine atoms on the surface of the resist pattern. More specifically, a protection film D with a high fluorine density is formed on the surface of the resist pattern P as shown in FIG. 9 to thereby improve the etch resistance of the resist pattern P.

When moved to the stop position P2, the liquid supply nozzle 131 is returned to the waiting section 134 after the discharge of the TFE solution is stopped. Subsequently, the wafer W is rotated by the spin chuck 120 so that the liquid on the wafer W is shaken off. Thereafter, the wafer W is transferred from the spin chuck 120 to the second carrier unit 11 and carried out of the liquid supply units 33.

The wafer W carried out of the liquid supply units 33 is carried, for example, to the high-temperature thermal processing unit 66 as an energy supply unit where the wafer W is heated. The heating accelerates the bond of TFE in which reaction is insufficient on the surface of the resist pattern P. Further, in the high-temperature thermal processing unit 66, excessive water is evaporated so that the resist pattern P is sintered.

The wafer W for which the heating in the high-temperature thermal processing unit 66 has been finished is temperature-regulated in the high-precision temperature regulating unit 64, then carried by the first carrier unit 10 to the transition unit 61, and then returned to the cassette C by the wafer carrier 7. The wafer W returned into the cassette C is carried to an etching apparatus (not shown) where etching step of the base film is performed using the resist pattern P as a mask (S5 in FIG. 8).

According to the above embodiment, the TFE solution is supplied to the resist pattern P after the resist pattern P is formed by the developing treatment, so that the density of the fluorine atoms on the surface of the resist pattern P can be increased to improve the etch resistance of the resist pattern P.

Further, since the TFE solution composed of TFE with a molecular weight of 50 or more is supplied to the resist pattern P, most TFE can bond with the molecules on the surface of the resist pattern P without permeation to the inside of the resist pattern P to efficiently increase the density of fluorine atoms on the surface of the resist pattern P. Further, TFE contains an OH group and therefore easily bonds with, for example, a methacrylate-based resist material.

According to the above-described embodiment, since the surfactant containing an OH group is supplied to the resist pattern P before supply of the TFE solution, the end of the surface molecule of the resist pattern P is the OH group and the surface molecule is unstable in polarity. As a result, the surface of the resist pattern P is activated, whereby the reactivity between the TFE solution and the surface of the resist pattern is improved. Accordingly, at the time of supply of the TFE solution, the bond of TFE on the surface of the resist pattern P is accelerated.

Since the temperature of the TFE solution is set to be higher than room temperature, the reaction between the TFE solution and the surface of the resist pattern is further accelerated. Further, since the temperature of the surfactant is set to be low in the order of room temperature, it is possible to prevent, for example, the OH group of the surfactant from separating from the main chain to degrade the surfactant.

Since the wafer W is heated to supply energy to the resist pattern P after the supply of the TFE solution to the resist pattern P, the bond of TFE which has been insufficient on the surface of the resist pattern P proceeds to enhance the bonding force of TFE.

While the surfactant is supplied to the resist pattern P before the supply of the TFE solution in the above embodiment, the supply of the TFE solution and the supply of the surfactant may be performed simultaneously. In this case, in the liquid supply nozzle 131, the opening/closing valves 153 and 163 are simultaneously opened to introduce the TFE solution and the surfactant into the main body 131a simultaneously. The TFE solution and the surfactant introduced into the main body 131a are mixed in the confluent room 192 and discharged from the discharge ports 194. The liquid supply nozzle 131 moves, discharging the mixed solution of the TFE solution and the surfactant, from the start position P1 to the stop position P2 to thereby supply the TFE solution and the surfactant to the surface of the resist pattern P simultaneously. In this case, since the TFE solution and the surfactant can be supplied simultaneously, the time required for the treatment step can be reduced.

While the TFE solution and the surfactant are supplied using the same liquid supply nozzle 131 in the above-described embodiment, a supply nozzle for supplying the TFE solution and a supply nozzle for supplying the surfactant may be separately provided in the liquid supply unit 33 to supply the surfactant and the TFE solution from the respective supply nozzles in order. Note that it is not always necessary to supply the surfactant to the resist pattern P in the above embodiment, but only the TFE solution may be supplied.

Figure 10:
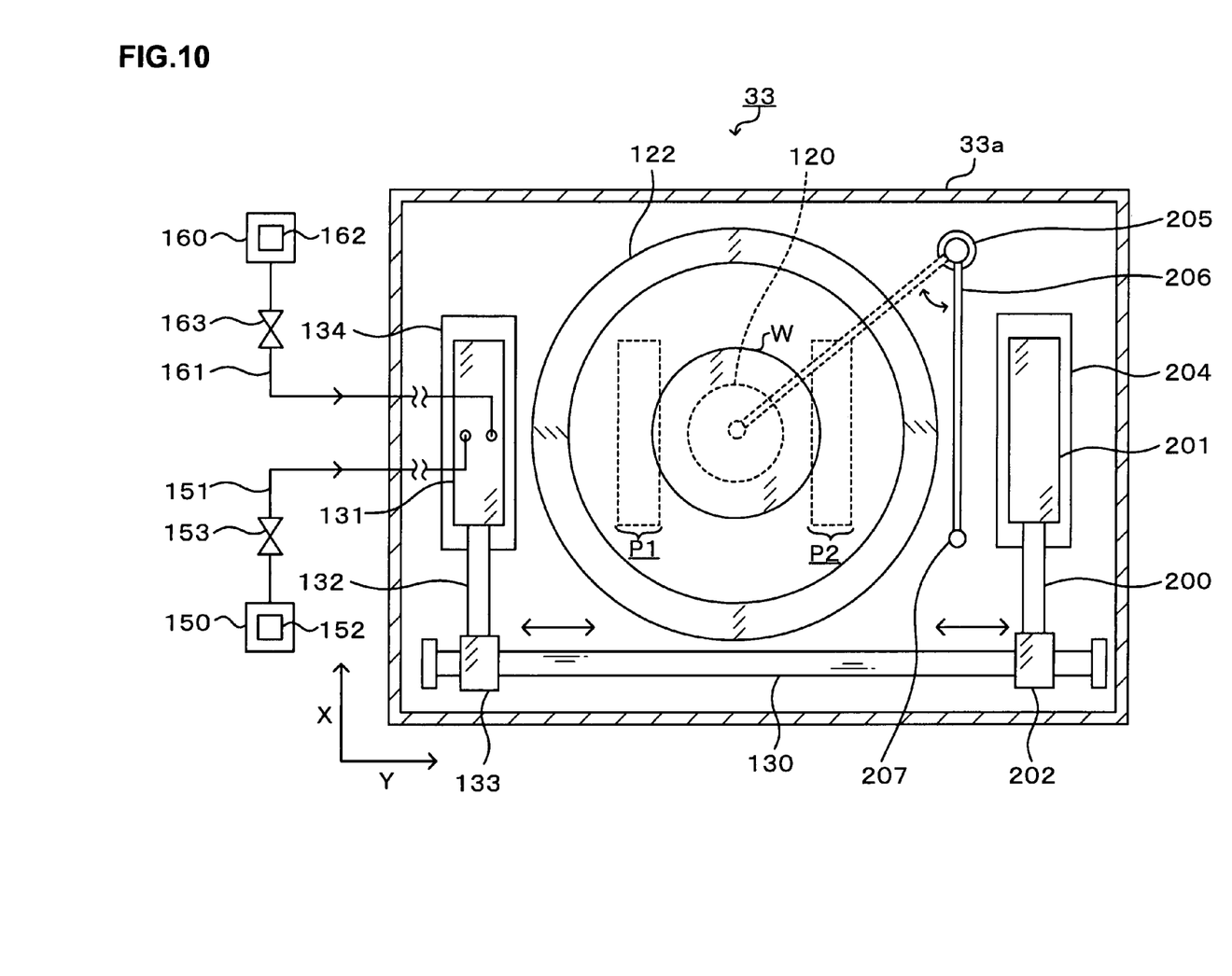
FIG. 10 An explanatory view of a transverse section showing the outline of a configuration of a liquid supply unit with a developing solution supply nozzle.

In the liquid supply unit 33, a function of performing developing treatment for the wafer W may be provided. FIG. 10 shows such an example in which, for example, a sub-arm 200 is attached to the rail 130 in the liquid supply unit 33 and a developing solution supply nozzle 201 is supported by the sub-arm 200. The sub-arm 200 is freely movable in the Y-direction on the rail 130, for example, by means of a drive unit 202 and can transfer the developing solution supply nozzle 201 from a nozzle waiting section 204 provided outside the cup 122 on the positive direction side in the Y-direction to a position above the wafer W in the cup 122. Note that the developing solution supply nozzle 201 in use has, for example, the same configuration as that of the liquid supply nozzle 131.

Further, for example, on the positive direction side in the Y-direction of the cup 122, a nozzle arm 206 is provided which pivots about the vertical axis by means of a rotary drive shaft 205. At the tip of the nozzle arm 206, a rinse solution discharge nozzle 207 is provided which discharges a rinse solution such as pure water or the like. The rinse solution discharge nozzle 207 can move to a position above the central portion of the wafer W in the cup 122 by pivoting of the nozzle arm 206 by means of the rotary drive shaft 205 to discharge the rinse solution to the central portion of the wafer W.

Then, for example, when the wafer W for which the exposure processing has been finished is carried into the liquid supply unit 33 and held on the spin chuck 120, the developing solution supply nozzle 201 first moves, discharging the developing solution, along the Y-direction from one end portion to the other end portion of the wafer W. Thereby, the developing solution is supplied to the entire front surface of the wafer W so that a resist pattern is formed on the wafer W after a lapse of a predetermined time. Thereafter, the wafer W is rotated, and the rinse solution discharge nozzle 207 moves to a position above the central portion of the wafer W and discharges the rinse solution to stop the development. Subsequently, the wafer W is rotated at a high speed, whereby the rinse solution is shaken off for dry. After the wafer W is dried, the liquid supply nozzle 131 moves from the start position P1 to the stop position P2 and supplies the surfactant and the TFE solution in order as in the above embodiment. In this case, since the developing step and the treatment step are sequentially performed in the same unit, the wafer treatment in this embodiment can be performed in a shorter time.

Figure 11:
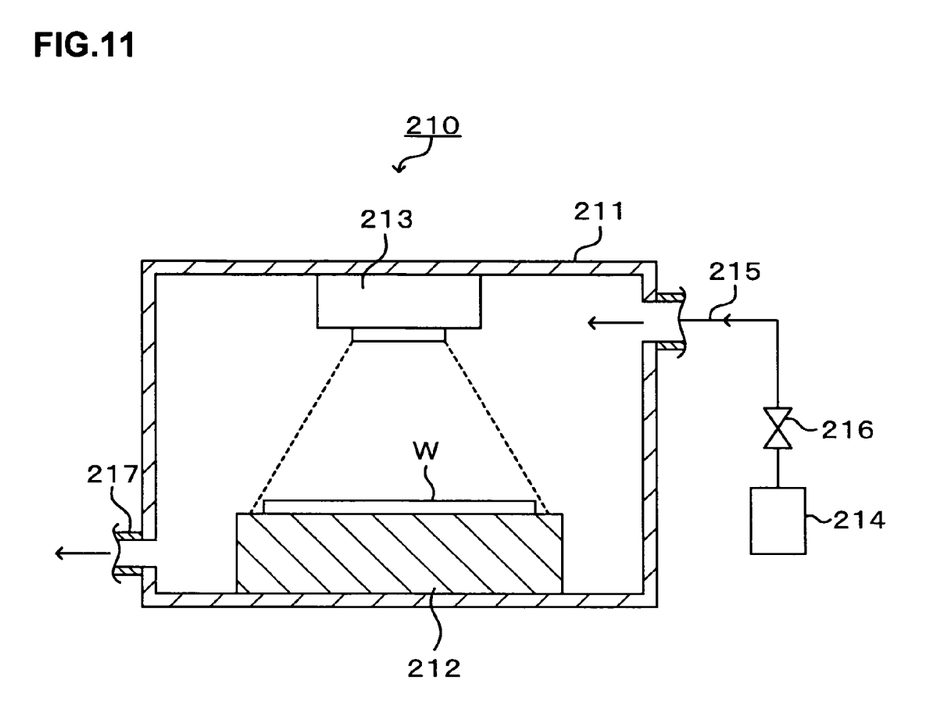
FIG. 11 An explanatory view of a longitudinal section showing the outline of a configuration of an ultraviolet irradiation unit.

While the wafer W is heated in the high-temperature thermal processing unit 66 after the TFE solution is supplied to the resist pattern P to accelerate the reaction of the TFE solution with the surface of the resist pattern P in the above embodiment, ultraviolet rays may be applied to the wafer W to accelerate the reaction of the TFE solution. In this case, an ultraviolet irradiation unit 210 as an energy supply unit as shown in FIG. 11 is installed, for example, in the coating and developing treatment system 1. The ultraviolet irradiation unit 210 includes, for example, a container 211 which houses the wafer W and can be hermetically closed. In the container 211, a mounting table 212, for example, in a circular shape for mounting the wafer W thereon is provided. An ultraviolet irradiator 213 is provided at the ceiling of the container 211 and can apply ultraviolet rays to the wafer W on the mounting table 212. To the side wall of the container 211, for example, a gas supply pipe 215 is connected which is in communication with a gas supply source 214 of a nitrogen gas which never reacts with the resist pattern. The gas supply pipe 215 is provided with, for example, an opening/closing valve 216. An exhaust pipe 217 is connected to the sidewall of the container 211 opposite to the gas supply pipe 215. The supply of the nitrogen gas from the gas supply pipe 215 and the exhaust from the exhaust pipe 217 can maintain a nitrogen gas atmosphere in the container 211.

After the wafer W to which the TFE solution has been supplied is carried into the ultraviolet irradiation unit 210, the wafer W is mounted on the mounting table 212, and the inside of the container 211 is then replaced with a nitrogen gas atmosphere. The ultraviolet irradiator 213 then applies the ultraviolet rays to the surface of the resist pattern P on the wafer W. The application of the ultraviolet rays supplies energy to the surface of the resist pattern P, whereby the reaction of TFE in which bond is insufficient proceeds to further increase the density of the fluorine atoms on the surface of the resist pattern P. This can further improve the etch resistance of the resist pattern P.

Figure 12:
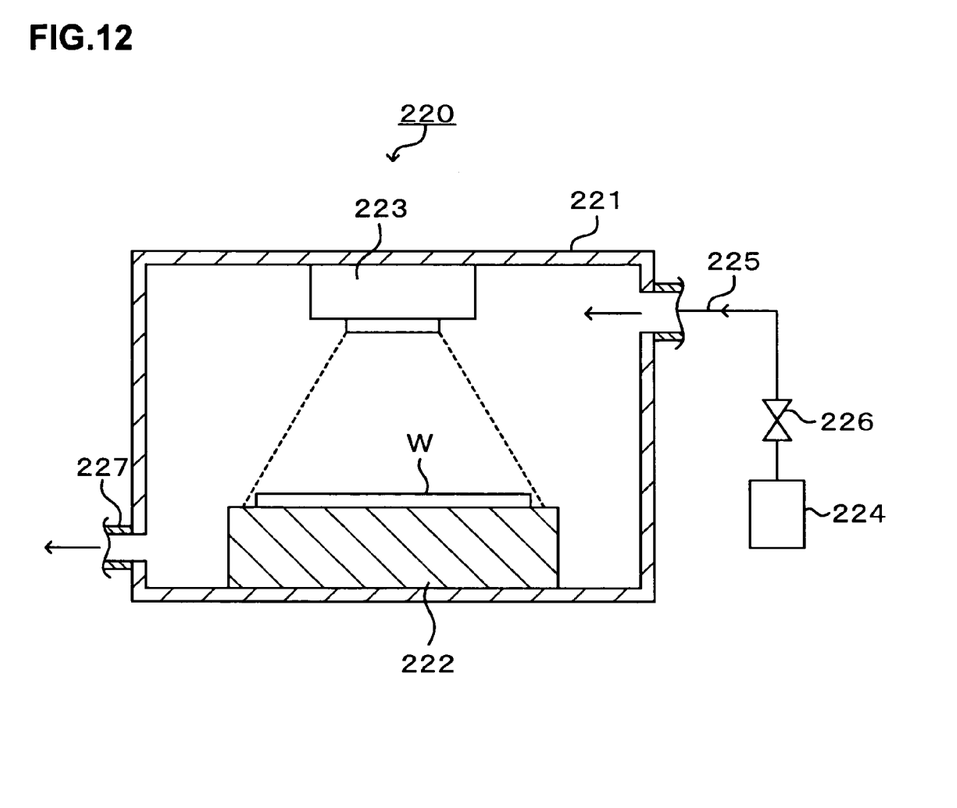
FIG. 12 An explanatory view of a longitudinal section showing the outline of a configuration of an oxidation unit.

In the above embodiment, the resist pattern P may be oxidized after the developing treatment and before the supply of the TFE solution. In this case, an oxidation unit 220 as shown in FIG. 12 is installed, for example, in the coating and developing treatment system 1. The oxidation unit 220 includes, for example, a container 221 in which a mounting table 222 is provided. An ultraviolet irradiator 223 is provided at the ceiling of the container 221. To the side wall of the container 221, for example, an air supply pipe 225 as an oxygen-containing gas supplier is connected which is in communication with an air supply source 224 of air. The air supply pipe 225 is provided with, for example, an opening/closing valve 226. An exhaust pipe 227 is connected to the sidewall of the container 221 opposite to the air supply pipe 225. The supply of air from the air supply pipe 225 and the exhaust from the exhaust pipe 227 can maintain an air atmosphere containing oxygen in the container 221.

For example, upon finish of the developing treatment, the wafer W is immediately carried into the oxidation unit 220 and mounted on the mounting table 222. When the wafer W is mounted on the mounting table 222, the inside of the container 221 is replaced with an oxygen-containing atmosphere. In the oxygen-containing atmosphere, the ultraviolet irradiator 223 applies the ultraviolet rays to the surface of the resist pattern P on the wafer W to oxidize the surface of the resist pattern P. After the surface of the resist pattern P is oxidized in the oxidation unit 220, the wafer W is carried into the liquid supply unit 33 and supplied with the TFE solution as in the above-described embodiment.

In this case, since the surface of the resist pattern P is oxidized before the supply of the TFE solution, the reactivity of the TFE solution with the resist pattern P is improved. As a result, at the time of supply of the TFE solution, TFE efficiently bonds with the molecules on the surface of the resist pattern P. Note that only an oxygen gas, instead of the air, may be supplied in the container 221 in this example.

The above embodiment shows an example of the present invention, and the present invention is not limited to this embodiment but may employ various forms. While the TFE solution is supplied to the resist pattern P in the above embodiment, another fluorine-based liquid, for example, HFE (hydrofluoroether), or fluorobenzene may be supplied in place of the TFE solution. Further, while the surfactant is supplied as the other liquid containing an OH group, an acetylene glycol-based chemical may be supplied in place of the surfactant. The above embodiment is an example of treating the wafer W, and the present invention is also applicable to the case of treating substrates other than the wafer, such as an FPD (Flat Panel Display), and a mask reticule for a photomask.

INDUSTRIAL APPLICABILITY

The present invention is useful in improving the etch resistance of a resist pattern in the lithography technology using, for example, an exposure light source with a wavelength shorter than that of an ArF laser.

What is claimed is:

1. A substrate treatment method comprising:
   developing a resist film on a substrate to form a resist pattern on the substrate;
   heat-processing the resist film after the developing; and thereafter,
   etching a base film using the resist pattern as a mask,
   wherein said method comprises,
   between said heat-processing step and said etching step, supplying a fluorine-based liquid to the heat processed resist pattern to form a protection film with a high fluorine density on a surface of the resist pattern.

2. The substrate treatment method as set forth in claim 1, wherein the fluorine-based liquid is composed of a compound with a molecular weight of 50 or more.

3. The substrate treatment method as set forth in claim 1, wherein the fluorine-based liquid contains an OH group.

4. The substrate treatment method as set forth in claim 1, further comprising:
   between said developing and said etchin, supplying another liquid containing an OH group to the resist pattern.

5. The substrate treatment method as set forth in claim 4, wherein said supplying another liquid containing an OH group is performed before said supplying the fluorine-based liquid.

6. The substrate treatment method as set forth in claim 4, wherein said supplying another liquid containing an OH group is performed simultaneously with said supplying the fluorine-based liquid.

7. The substrate treatment method as set forth in claim 4, wherein the temperature of the fluorine-based liquid is set to be higher than room temperature, and the temperature of the other liquid containing an OH group is set to be lower than the temperature of fluorine-based liquid.

8. The substrate treatment method as set forth in claim 4, wherein the other liquid containing an OH group is a surfactant.

9. The substrate treatment method as set forth in claim 1, further comprising:
   supplying energy to the resist pattern to which the fluorine-based liquid has been supplied and thereby accelerating the reaction of the fluorine-based liquid with the surface of the resist pattern.

10. The substrate treatment method as set forth in claim 9, wherein said accelerating the reaction of the fluorine-based liquid with the surface of the resist pattern is performed by heating the substrate.

11. The substrate treatment method as set forth in claim 9, wherein said accelerating the reaction of the fluorine-based liquid with the surface of the resist pattern is performed by applying an ultraviolet ray to the substrate.

12. The substrate treatment method as set forth in claim 1, further comprising:
   after said developing and before said supplying a fluorine-based liquid, oxidizing the surface of the resist pattern.

13. The substrate treatment method as set forth in claim 12, wherein said oxidizing the surface of the resist pattern is performed by applying an ultraviolet ray to the substrate with the substrate being maintained in an atmosphere containing an oxygen gas.

* * * * *